United States Patent
Mizrahi

(10) Patent No.: US 12,471,250 B1
(45) Date of Patent: Nov. 11, 2025

(54) LIQUID COOLING ASSEMBLY FOR ELECTRONIC COMPONENTS ON PRINTED CIRCUIT BOARDS AND COMPUTING DEVICE INCLUDING SAME

(71) Applicant: NEXT SILICON LTD., Givatayim (IL)

(72) Inventor: Yehuda Mizrahi, Kfar Yona (IL)

(73) Assignee: NEXT SILICON LTD., Givatayim (IL)

( * ) Notice: Subject to any disclaimer, the term of this patent is extended or adjusted under 35 U.S.C. 154(b) by 0 days.

(21) Appl. No.: 19/058,176

(22) Filed: Feb. 20, 2025

(51) Int. Cl.
*H05K 7/20* (2006.01)
*H05K 1/02* (2006.01)

(52) U.S. Cl.
CPC ....... *H05K 7/20272* (2013.01); *H05K 1/0203* (2013.01); *H05K 7/20254* (2013.01); *H05K 7/2049* (2013.01); *H05K 2201/066* (2013.01); *H05K 2201/10598* (2013.01)

(58) Field of Classification Search
CPC .......... H05K 7/20254; H05K 7/20218; H05K 7/20272; H05K 7/2049; H05K 1/0203; H05K 2201/066; H05K 7/20772; H05K 7/20927; H05K 7/20781; H01L 23/473; F28F 3/12
See application file for complete search history.

(56) References Cited

U.S. PATENT DOCUMENTS

| | | | |
|---|---|---|---|
| 9,345,169 B1 | 5/2016 | Campbell | |
| 10,044,078 B2 | 8/2018 | Jung | |
| 10,477,731 B1 * | 11/2019 | Fu | H05K 7/20818 |
| 10,542,640 B1 * | 1/2020 | Leigh | H05K 7/20772 |
| 10,952,354 B1 | 3/2021 | Chen | |
| 2006/0002086 A1 | 1/2006 | Teneketges | |
| 2010/0277868 A1 * | 11/2010 | Beaupre | H01L 23/473 361/700 |
| 2011/0021355 A1 | 1/2011 | Zank et al. | |
| 2011/0212355 A1 * | 9/2011 | Essinger | H01M 10/6555 429/120 |
| 2012/0212175 A1 * | 8/2012 | Sharaf | H05K 5/069 220/592.01 |
| 2013/0025826 A1 | 1/2013 | Sakamoto | |
| 2014/0295228 A1 * | 10/2014 | Yan | H01M 10/658 429/83 |
| 2015/0079442 A1 * | 3/2015 | Haussmann | H01M 10/6556 429/120 |

(Continued)

*Primary Examiner* — Adam B Dravininkas
(74) *Attorney, Agent, or Firm* — The Roy Gross Law Firm, LLC; Roy Gross

(57) ABSTRACT

The present invention relates to the technological field of microelectronics and electronic engineering, specifically to advanced liquid-cooling-based thermal management systems for electronic components on printed circuit boards. The claimed invention represents a liquid cooling assembly and a computing device that provide an improvement to the technological field of microelectronics and electronic engineering. Specifically, the suggested solution is easily adjustable to mitigate mechanical tolerances between the different electrical components of the target PCB and adaptable to address the diverse thermal loads presented by them, while maintaining the compactness of the design. The suggested solution thereby increases the overall heat dissipation efficiency of thermal management systems.

20 Claims, 9 Drawing Sheets

(56) References Cited

U.S. PATENT DOCUMENTS

| | | | |
|---|---|---|---|
| 2015/0318587 A1* | 11/2015 | Kim | H01M 10/425 320/112 |
| 2016/0183409 A1* | 6/2016 | Zhou | H01L 23/4735 165/104.31 |
| 2021/0176896 A1 | 6/2021 | Yang | |
| 2021/0378147 A1 | 12/2021 | Chehade | |
| 2022/0248560 A1 | 8/2022 | Zhou | |
| 2022/0312637 A1* | 9/2022 | Norton | H05K 7/20772 |
| 2022/0377940 A1* | 11/2022 | Yang | G06F 1/20 |
| 2023/0139202 A1* | 5/2023 | Zhou | H05K 7/20254 361/699 |
| 2023/0422389 A1* | 12/2023 | Subrahmanyam | H05K 1/0203 |

\* cited by examiner

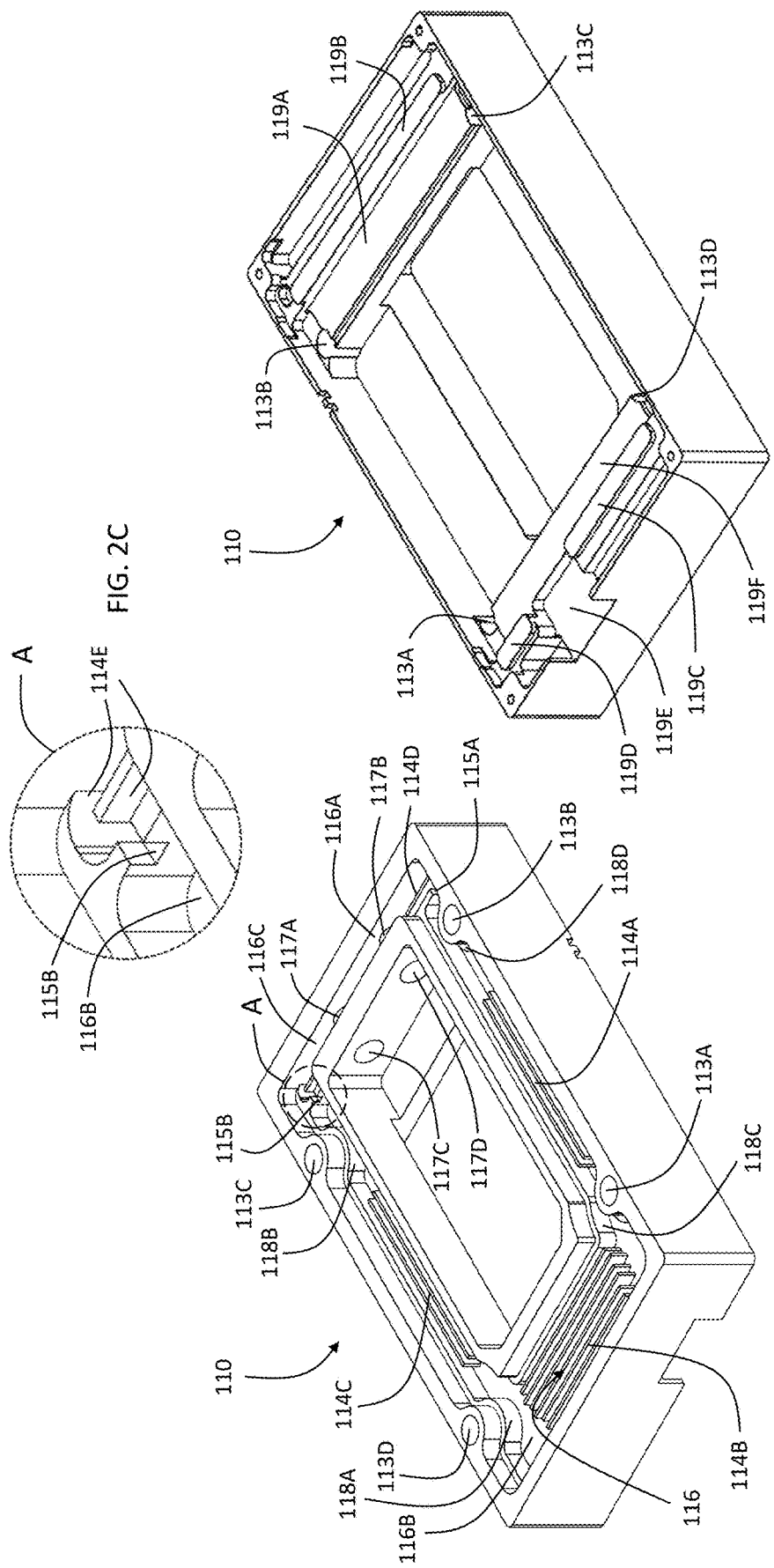

LIQUID COOLING ASSEMBLY FOR ELECTRONIC COMPONENTS ON PRINTED CIRCUIT BOARDS AND COMPUTING DEVICE INCLUDING SAME

FIELD OF THE INVENTION

The present invention relates to the technological field of microelectronics and electronic engineering, specifically to advanced liquid-cooling-based thermal management systems for electronic components on printed circuit boards.

BACKGROUND OF THE INVENTION

In the field of microelectronics and electronic engineering, efficient thermal management is crucial for ensuring optimal performance and longevity of electronic components. As electronic circuits become increasingly complex and densely packed, the challenge of dissipating heat effectively has intensified. Traditional cooling methods, such as air cooling with fans or passive solutions, often fall short in addressing the thermal demands of modern high-performance electronics. These conventional solutions can lead to overheating, reduced efficiency, and potential damage to sensitive components, necessitating the development of more advanced cooling technologies.

Liquid cooling systems have emerged as a promising alternative, offering superior heat dissipation capabilities by circulating a fluid to absorb and transfer heat away from components. However, the existing heat dissipation problem is further exacerbated by the fact that different components on the PCB may exhibit varying power densities, leading to significantly different heat dissipation requirements. Existing solutions often lack flexibility and adaptability, particularly in accommodating varying thermal loads across different parts of a system. This limitation can result in uneven cooling, inefficient energy use, and increased complexity in system design and maintenance.

In addition to thermal management challenges, mechanical tolerances between various components of the printed circuit board (PCB) pose significant problems. These tolerances may arise from manufacturing limitations, such as soldering, leading to major heat-dissipative areas that are slightly unparallel. When using a single rigid cooling element, such as a heat sink, that must have proper contact with the heat-dissipating areas of multiple components simultaneously, any geometrical misalignment between the components can adversely affect the contact. As optimal thermal transfer relies on precise contact between the heat sink and the components, misalignment can dramatically reduce cooling efficiency.

Another important aspect to consider, alongside cooling efficiency, is the compactness of the design. In many cases, the volume inside the target device housing is limited, making it crucial to develop a cooling system that not only effectively manages heat but also fits within the spatial constraints of the device. This requires a balance between performance and design compactness to ensure that the cooling solution does not compromise the overall functionality and form factor of the electronic device.

SUMMARY OF THE INVENTION

Accordingly, there is a need for a liquid cooling assembly that would provide an improvement to the technological field of microelectronics and electronic engineering. Specifically, there is a need for a solution that is easily adjustable to mitigate mechanical tolerances between the different electrical components of the target PCB and adaptable to address the diverse thermal loads presented by them, while maintaining the compactness of the design. Such a solution would thereby increase the overall heat dissipation efficiency of thermal management systems. It is further a need for a computing device that includes such an improved liquid cooling assembly, which would improve the aforementioned technological field by increasing device operation efficiency, specifically enabling prolonged and stable operation in computationally intensive regimes due to highly efficient thermal management.

In the general aspect, the present invention may be directed to a liquid cooling assembly. The liquid cooling assembly may include at least one first heat sink, configured to be thermally coupled to at least one first electronic component mounted on a printed circuit board (PCB); and at least one second heat sink, configured to be thermally coupled to at least one second electronic component mounted on the PCB. Said at least one first heat sink may have an inner cavity fluidically connectable to a liquid coolant distribution unit and configured to form therewith a first liquid coolant circulation pathway. Said at least one second heat sink may have an inner cavity in flexible fluid connection to the inner cavity of said at least one first heat sink and configured to form, together with the liquid coolant distribution unit, a second liquid coolant circulation pathway, while sharing, with the first liquid coolant circulation pathway, a common inlet and outlet connection to the liquid coolant distribution unit.

In another general aspect, the present invention may be directed to a computing device. The computing device may include: a printed circuit board (PCB) including at least one first electronic component and at least one second electronic component mounted thereon; at least one first heat sink thermally coupled to said at least one first electronic component; and at least one second heat sink thermally coupled to said at least one second electronic component. Said at least one first heat sink may have an inner cavity fluidically connectable to a liquid coolant distribution unit and configured to form therewith a first liquid coolant circulation pathway; said at least one second heat sink may have an inner cavity in flexible fluid connection to the inner cavity of said at least one first heat sink and configured to form, together with the liquid coolant distribution unit, a second liquid coolant circulation pathway, while sharing, with the first liquid coolant circulation pathway, a common inlet and outlet connection to the liquid coolant distribution unit.

In some embodiments of the liquid cooling assembly, said at least one first electronic component may include a group of ancillary electronic components mounted in a peripheral area of the PCB; said at least one second electronic component may include an integrated circuit (IC) mounted in a central area of the PCB; said at least one first heat sink may have a frame-shaped structure sized corresponding to dimensions of said peripheral area; and said at least one second heat sink may be configured so as to be positioned substantially within said frame-shaped structure, when the liquid cooling assembly is attached to the PCB.

Accordingly, in some embodiments of the computing device, said at least one first electronic component may include a group of ancillary electronic components mounted in a peripheral area of the PCB; said at least one second electronic component may include an integrated circuit (IC) mounted in a central area of the PCB; said at least one first heat sink may have a frame-shaped structure sized corresponding to dimensions of said peripheral area; and said at least one second heat sink may be positioned substantially within said frame-shaped structure.

In some embodiments, said flexible fluid connection may include at least one flexible inlet tube and at least one flexible outlet tube fluidically connecting the inner cavity of said at least one second heat sink with the inner cavity of said at least one first heat sink from the inner side of the frame-shaped structure.

In some embodiments of the liquid cooling assembly, said at least one first heat sink and said at least one second heat sink may each be configured to be thermally coupled to said at least one first electronic component and said at least one second electronic component, respectively, by being pressed onto a heat-dissipating areas thereof using mechanically isolated groups of tightening elements.

Accordingly, in some embodiments of the computing device said at least one first heat sink and said at least one second heat sink may each be thermally coupled to said at least one first electronic component and said at least one second electronic component, respectively, by being pressed onto heat-dissipating areas thereof using mechanically isolated groups of tightening elements.

In some embodiments, the liquid cooling assembly may further include a base member having at least two groups of mounting openings configured so as to align with respective groups of mounting openings of the PCB, when the base member may be positioned adjacent to the bottom side of the PCB, in an assembled state of the liquid cooling assembly; and wherein said mechanically isolated groups of tightening elements may include: a first group of spring-loaded screws configured to fix, in the assembled state, said at least one first heat sink to the base member through a first group of mounting openings of the base member and a respective group of mounting opening of the PCB, and to substantially uniformly press the first heat sink onto the heat-dissipating area of said at least one first electronic component, when being tightened; and a second group of spring-loaded screws configured to fix, in the assembled state, said at least one second heat sink to the base through a second group of mounting openings of the base member and a respective group of mounting opening of the PCB, and to substantially uniformly press the second heat sink onto the heat-dissipating area of said at least one second electronic component, when being tightened.

In some embodiments, at least one of said first heat sink or said second heat sink may include a plurality of standoffs distancing, in the assembled state, a respective heat sink from the PCB and comprising threaded openings configured to receive a respective group of spring-loaded screws.

In some embodiments, said standoffs and said spring-loaded screws may be configured so as avoid mechanical interference with the PCB.

In some embodiments, the liquid cooling assembly may be further configured to split an input liquid coolant flow, passing through the common inlet connection, between said first liquid coolant circulation pathway and said second liquid coolant circulation pathway in a predefined ratio.

In some embodiments, said predefined ratio may be defined corresponding to an expected power consumption ratio between said at least one first electronic component and said at least one second electronic component.

In some embodiments, the liquid cooling assembly may be further configured to split the input liquid coolant flow by directing a first portion thereof through an input channel of said at least one first heat sink and a second portion thereof through an input channel of said at least one second heat sink, said input channel of said at least one first heat sink and the input channel of said at least one second heat sink being sized corresponding to said predefined ratio.

In some embodiments, the input channel of said at least one first heat sink and an output channel of said at least one first heat sink may be made adjacent to an upper wall of the inner cavity of said at least one first heat sink.

In some embodiments, the input channel of said at least one second heat sink and an output channel of said at least one second heat sink may be made adjacent to an upper wall of the inner cavity of said at least one second heat sink.

In some embodiments, said inner cavity of said at least one first heat sink may include a plurality of inner channels; and said inner cavity of the at least one first heat sink may be shaped so as to distribute a liquid coolant flow passing therethrough substantially evenly between the plurality of inner channels thereof.

In some embodiments, said inner cavity of said at least one second heat sink may include a plurality of inner channels; and said inner cavity of the at least one second heat sink may be shaped so as to distribute a liquid coolant flow passing therethrough substantially evenly between the plurality of inner channels thereof.

In some embodiments, said at least one first heat sink may be configured to be thermally coupled to said at least one first electronic component via a thermal pad attached to a heat-dissipating area thereof.

In some embodiments, said at least one second heat sink may be configured to be thermally coupled to said at least one second electronic component via a thermal pad attached to a heat-dissipating area thereof.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2B is an isometric view of the top side of a first heat sink, according to some embodiments of the present invention;

FIG. 2C is an enlarged isometric view of the output channel of the first heat sink, according to some embodiments of the present invention;

FIG. 2D is an isometric view of the bottom side of the first heat sink, according to some embodiments of the present invention;

Figure 1:
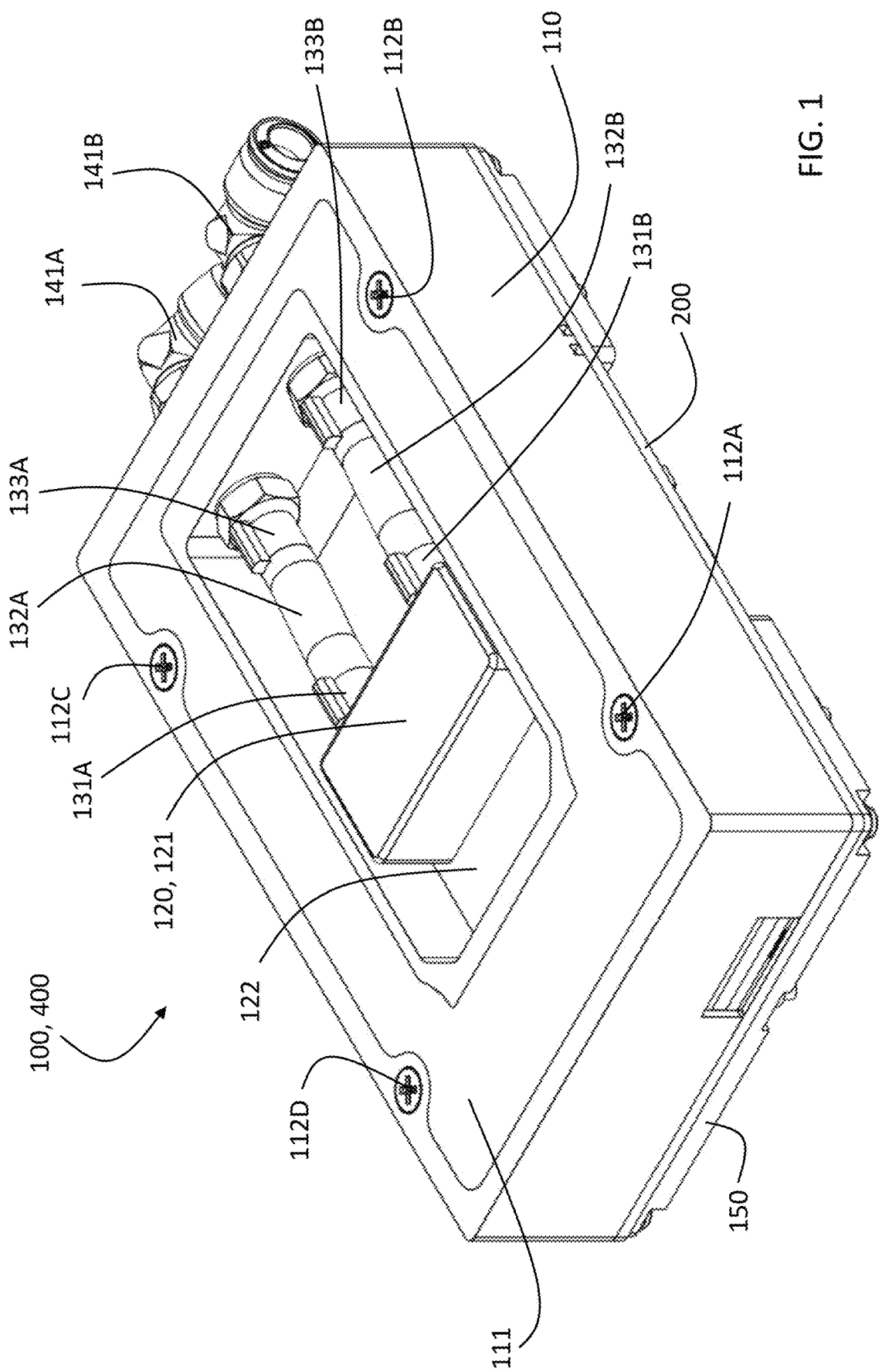
FIG. 1 is an isometric view of a liquid cooling assembly and a computing device, according to some embodiments of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. The term "set" when used herein may include one or more items.

As used herein, the term "fluid connection" refers to a path which allows fluid to flow between two components of the system of the present invention, wherein said two components can be directly or indirectly joined to each other. Similarly, as used herein, the terms "fluidically coupled", "fluidically connected" or "fluidically connectable" refer to a connection between two components that allows fluid to flow from one component to the other, wherein said connection may be direct or indirect (via intermediate components) enabling fluid flow therethrough.

In the context of the present invention, the term "flexible fluid connection" shall be understood to refer to a mechanically flexible connection that facilitates the transfer of fluids between connectable components, e.g., to the connection that may be achieved through the use of flexible tubes or similar components, which are designed to accommodate and mitigate mechanical tolerances and misalignments between the components connectable thereby.

It should be understood that the terms 'first' and 'second' are used solely to differentiate between elements unambiguously and do not imply any specific order or sequence unless explicitly stated otherwise.

Unless explicitly stated, the method embodiments described herein are not constrained to a particular order or sequence. Additionally, some of the described method embodiments or elements thereof can occur or be performed simultaneously, at the same point in time, concurrently, or iteratively and repeatedly.

According to the concept of the present invention, the suggested configuration allows for efficient thermal management by enabling separate cooling pathways for different components, which can have varying thermal loads. The flexible fluid connection between the heat sinks provides adaptability to mechanical tolerances and misalignments on the PCB, ensuring effective thermal contact and heat dissipation. By sharing a common inlet and outlet, the system simplifies the design and reduces the complexity of the cooling assembly, making the assembly more compact and easier to integrate into electronic devices with limited space. This arrangement enhances the overall heat dissipation efficiency, addressing the diverse thermal requirements of modern high-performance electronics.

Accordingly, a suggested computing device that includes such an improved liquid cooling assembly, may provide prolonged and stable operation in computationally intensive regimes due to highly efficient thermal management, while having a compact design.

Reference is now made to FIGS. 1, showing an isometric view of liquid cooling assembly 100 and computing device 400, according to some embodiments of the present invention.

For the purpose of clarity and conciseness, the following description may, in some respects, relate solely to the liquid cooling assembly. However, it shall be understood that the same principles and descriptions may be equally applied to the suggested computing device, as it may include the liquid cooling assembly in all embodiments discussed herein.

Furthermore, for the purpose of clarity and conciseness, the description of similar or identical components shown in the provided Figures may be omitted.

As shown in FIG. 1, in some embodiments, computing device 400 may include printed circuit board (PCB) 200 including a plurality of electronic components mounted thereon (described in detail with reference to FIG. 2A).

Printed circuit boards (PCBs) are foundational components in electronic devices, serving as platforms for mounting and interconnecting various electronic components. PCB (such as PCB 200) usually consist of a non-conductive substrate, typically made of fiberglass, composite epoxy, or other laminate materials, onto which conductive pathways are etched or printed. These pathways, often made of copper, facilitate electrical connections between electrical components installed thereon.

As known, heat sinks are essential components in thermal management systems for PCBs. They are commonly designed to dissipate heat generated by electronic components, such as microprocessors and power transistors, to prevent overheating and ensure optimal performance.

In some embodiments, liquid cooling assembly 100 may include at least one first heat sink (e.g., heat sink 110) and at least one second heat sink (e.g., heat sink 120).

In some embodiments, heat sink 110 may have a frame-shaped structure sized corresponding to the dimensions of the peripheral area of PCB 200, as shown in FIG. 1.

In some embodiments, heat sink 120 may be configured so as to be positioned substantially within the frame-shaped structure of heat sink 110, when liquid cooling assembly 100 is attached to PCB 200 (i.e., when device 400 is in the assembled state, as shown in FIG. 1).

In some embodiments, inner cavity 116 (explained in detail with reference to FIG. 2B) of heat sink 110 may be closed, from the upper side, with cover 111. Cover 111 may be welded to the main body of heat sink 110 to hermetically seal inner cavity 116.

In some embodiments, heat sink 120 may include portions 121 and 122 (explained in greater detail with reference to FIGS. 2G-2K).

In some embodiments, liquid cooling assembly 200 may further include at least one flexible inlet tube 132B and at least one flexible outlet tube 132A. In some embodiments, heat sinks 110 and 120 may have inner cavities for liquid coolant circulation (e.g., inner cavity 116 and inner cavity 126, shown in FIGS. 2B and 2J, respectively). In some embodiments, tubes 132A and 132B may fluidically connect the inner cavities of heat sinks 110 and 120 from the inner side of the frame-shaped structure, as shown in FIG. 1. Tube 132A may be connected to the inner cavities 116 and 126 of heat sinks 110 and 120 via fittings 133A and 131A, respectively. Tube 132B may be connected to the inner cavities 116 and 126 of heat sinks 110 and 120 via fittings 133B and 131B, respectively.

In some embodiments, heat sinks 110 and 120 may be made from materials with high thermal conductivity, like aluminum or copper, as commonly known in the art.

In some embodiments, heat sink 110 and/or heat sink 120 may also be referred to as cold plates. Both "heat sinks" and "cold plates" are commonly known names for such components of thermal management systems, and may be used interchangeably in the present context.

In some embodiments, liquid cooling assembly 100 may further include base member 150. In the assembled state of assembly 100, base member 150 may be positioned adjacent to the bottom side of PCB 200. Base member 150 may be used to attach heat sinks 110 and 120 to PCB 200, while avoiding unnecessary mechanical interferences therebetween, thereby ensuring high efficiency of heat dissipation. E.g., heat sink 110 may be attached to base member 150 via screws 112A-112D.

In some embodiments, liquid cooling assembly 100 may be fluidically connectable to a liquid coolant distribution unit (not shown), e.g., via inlet and outlet fittings 141B and 141A, respectively (also referred herein as inlet and outlet connection).

As known, liquid coolant distribution unit (CDU) is a critical component in thermal management of computer systems, particularly for data centers. Its primary function is to manage and regulate the distribution of coolants to ensure efficient thermal management. Accordingly, in some embodiments, computing device 400 may be part of a larger system, with the CDU operatively connected to multiple components of that system simultaneously.

The components of liquid cooling assembly 100 and computing device 400 are further described in greater detail with reference to FIGS. 2A-2K.

Figure 2A:
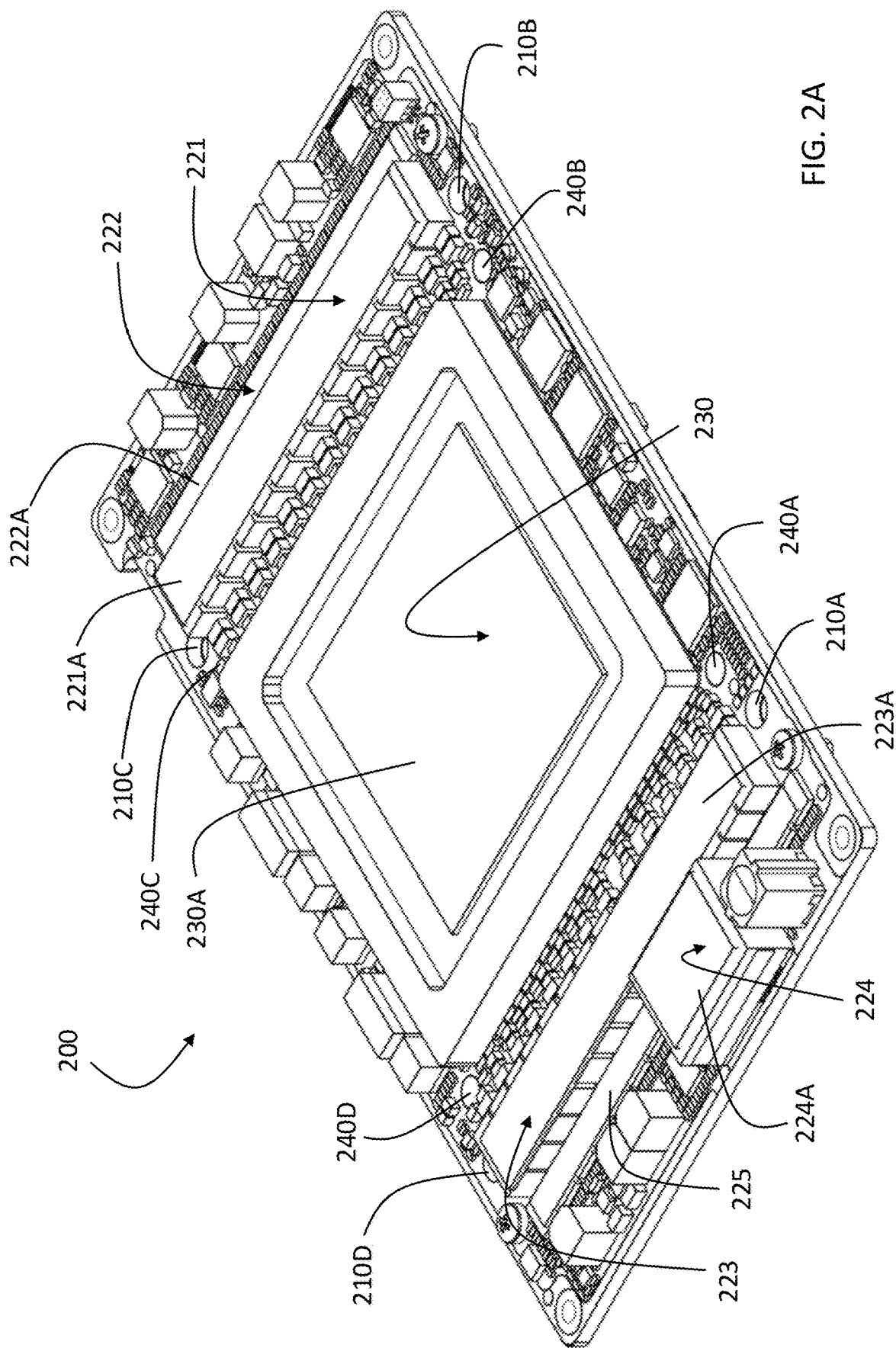
FIG. 2A is an isometric view of a PCB, according to some embodiments of the present invention.

FIG. 2A illustrates PCB 200 (component side), according to some embodiments of the present invention. It shall be understood that the embodiment of PCB 200 shown herein is provided as a non-exclusive example and for illustration purposes only. The provided embodiment of PCB 200 is intended to clarify how electronic components requiring thermal management may be positioned and how the design of liquid cooling assembly 100 can be adapted to the PCB layout topology to effectively dissipate heat. Furthermore, when discussing computing device 400, the concept of the present invention primarily relates to thermal management aspects, which may potentially improve the performance of a wide variety of computing devices. Hence, the present invention does not relate to any particular functions of computing device 400. Accordingly, the present invention shall not be considered limited to any specific type of computing device or intended use thereof, nor to any particular PCB or its intended use.

As shown in FIG. 2A, PCB 200 may include a wide array of components such as resistors, capacitors, diodes, transistors, and integrated circuits (ICs), each serving specific functions within the electronic system. Additionally, in some embodiments, PCB 200 can incorporate connectors, switches, and other mechanical components to interface with external devices or systems. As known, PCB design plays a crucial role in creating customized liquid cooling assembly, as it determines the layout and arrangement of the components, impacting the overall performance, reliability, heat dissipation characteristics and manufacturability of the electronic device.

In some embodiments, PCB 200 may include power-intensive electronic components requiring thermal management for normal operation.

In some particular embodiments, PCB 200 may include integrated circuit (IC) 230 mounted in the central area of PCB 200. In some embodiments, IC 230 may be a SoC (System on Chip), an FPGA (Field-Programmable Gate Array), an ASIC (Application-Specific Integrated Circuit), an ASSP (Application-Specific Standard Product) or similar electronic component known in the field. IC 230 may perform data processing, memory storage, signal processing, power management or other functions, as known in the field.

In some particular embodiments, PCB 200 may further include a group of ancillary electronic components mounted in a peripheral area of PCB 200. In some embodiments, ancillary electronic components may include various elements mounted in the peripheral area of a PCB, such as power transistors, resistors, capacitors, inductors, diodes, connectors, and may also include ancillary chips, controllers or similar components that configured to support the primary function of IC 230. The group of ancillary electronic components may include power-intensive components 221, 222, 223, 224 and 225, requiring heat dissipation for normal operation.

In some embodiments, PCB 200 may include two groups of mounting openings. The first group, comprising mounting openings 210A-210D, may be configured for the attachment of heat sink 110, as detailed in FIG. 3A. The second group, comprising mounting openings 240A-240D, may be configured for the attachment of heat sink 120, as detailed in FIG. 3B.

Reference is now made to FIGS. 2B-2D, showing aspects of heat sink 110, in some embodiments of the present invention.

As shown in FIG. 2B, illustrates an isometric view of the top side of heat sink 110, according to some embodiments of the present invention.

As shown in FIG. 2B, heat sink 110 may have inner cavity 116 around the perimeter of its frame-shaped structure. Inner cavity 116 may be divided into sections 116A, 116B and 116C. Section 116A may be connected to section 116B via input channel 115A. Section 116B may be connected to section 116C via output channel 115B. In section 116A, heat sink 110 may further include inlet opening 117B. In section 116C, heat sink 110 may further include outlet opening 117A. Inner cavity 116 may be fluidically connectable to the liquid coolant distribution unit (not shown) and configured to form therewith a liquid coolant circulation pathway (also referred herein as the "first" liquid coolant circulation pathway), e.g., from liquid coolant distribution unit via inlet opening 117B to section 116A—via input channel 115A to section 116B—via output channel 115B to section 116C—via outlet opening 117A to liquid coolant distribution unit. The aspects of liquid coolant circulation are further explained in greater detail with reference to FIG. 4. By providing liquid coolant circulation around the frame-shaped structure, assembly 100 allows efficient heat dissipation from the electronic components thermally coupled to heat sink 110.

In some embodiments, inner cavity 116 may include a plurality of inner channels 114A-114E. Inner cavity 116 may be shaped so as to distribute the liquid coolant flow passing therethrough substantially evenly between the plurality of inner channels thereof. E.g., in some embodiments, heat sink 110 may have projections 118A-118D, that are configured to direct the flow so as to distribute it between the respective inner channels 114A-114E (further explained in greater detail with reference to FIG. 4).

As shown in FIG. 2B, inner channels 114A-114E may be formed by a series of separating inner walls positioned along the flow direction. This configuration not only ensures even flow distribution but also significantly increases the heat-conducting area of heat sink 110 in direct contact with the liquid coolant flow, thereby enhancing heat dissipation efficiency.

From the inner side of the frame-shaped structure, heat sink 110 may further include openings 117C and 117D to provide fluid connection with heat sink 120 (not shown). Thereby, section 116A of inner cavity 116 may be configured so that the flow entering through inlet opening 117B is divided into two pathways: the first goes via input channel 115A through section 116B of inner cavity 116 and the second goes via opening 117D and tube 132B (not shown) to heat sink 120. Section 116C, in turn, is configured so that the flow, after passing through section 116B of inner cavity 116, enters through output channel 115B and exits through outlet opening 117A, mixing with the flow returning from heat sink 120 via tube 132A (not shown) and opening 117C.

Heat sink 110 may also include through mounting openings 113A-113D for mounting on PCB 200 using base member 150 (not shown) and screws 112A-112D (not shown).

FIG. 2C is an enlarged isometric view (marked "A" in FIG. 2B) of output channel 115B connecting sections 116B and 116C of inner cavity 116, according to some embodiments of the present invention. FIG. 2C also shows two inner channels 114E separated by the inner wall. It shall be understood that input channel 115A and inner channels 114D may have a configuration symmetrical to the configuration shown in FIG. 2C.

It should be understood that, although in FIGS. 2B and 2C the elements positioned inside cavity 116, such as channels 114A-114E and channels 115A and 115B, appear without an upper wall, heat sink 110 may be configured so that, when covered with cover 111 (as shown in FIG. 1), the upper wall of these elements is formed by the inner side of cover 111. Accordingly, with cover 111 in place, each of channels 114A-114E and 115A-115B may have a closed or substantially closed shape (e.g., rectangular) in cross-section.

FIG. 2D is an isometric view of the bottom side of heat sink 110, according to some embodiments of the present invention. As shown in FIG. 2D, from the bottom side, heat sink 110 may include a group of contact surfaces 119A-119F, configured so as to be thermally coupled with heat dissipating areas of respective ancillary electronic components 221-225 of PCB 200. E.g., surface 119A may be coupled with component 221, surface 119B may be coupled with component 222, surface 119F may be coupled with component 223, surfaces 119C-119D may be coupled with component 225 and surface 119E may be coupled with component 224.

In some embodiments, to perform said thermal coupling, thermal pads may be used (shown e.g., thermal pads 221A, 222A, 223A, 224A and 230A, as shown in FIG. 2A).

As known in the art, thermal pads are soft, thermally conductive materials used to fill gaps between heat-generating components and heat sinks. They help improve heat transfer and ensure efficient thermal management in electronic devices. In some embodiments, thermal pads may be made from silicone or other thermally conductive materials, infused with ceramic or metallic particles to enhance thermal conductivity. Thermal pads may therefore provide a conformal interface between uneven surfaces (e.g., contact surfaces 119A-119F and surfaces of respective components 221-225), ensuring good thermal contact along the entire heat dissipating area and reducing thermal resistance.

In some embodiments, by having contact surfaces 119A-119F sized and positioned accordingly to the layout and dimensions of components 221-225, heat sink 110 may be configured to be thermally coupled to these components, e.g., via thermal pads attached to heat-dissipating areas thereof.

Accordingly, it should be understood that, depending on specific embodiments, heat sink 110 may be custom-designed to match the specific configuration, layout, and content of the electronic components on the target PCB (such as PCB 200), to meet its thermal management requirements.

In the context of the present description, term "contact surfaces" applies to thermal coupling and shall not be confused with contact surfaces applied for electrical coupling.

Figure 2F:
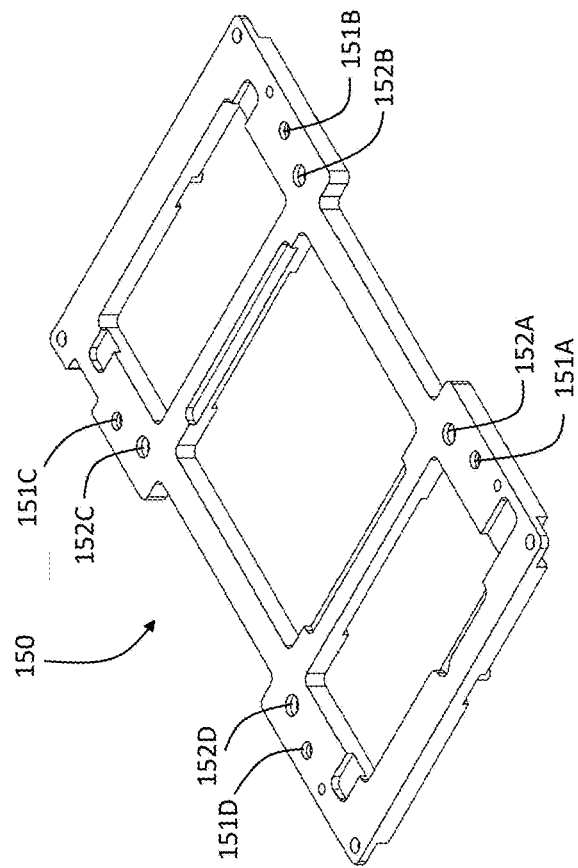
FIG. 2F is an isometric view of the base member of the liquid cooling assembly, according to some embodiments of the present invention.
Figure 2E:
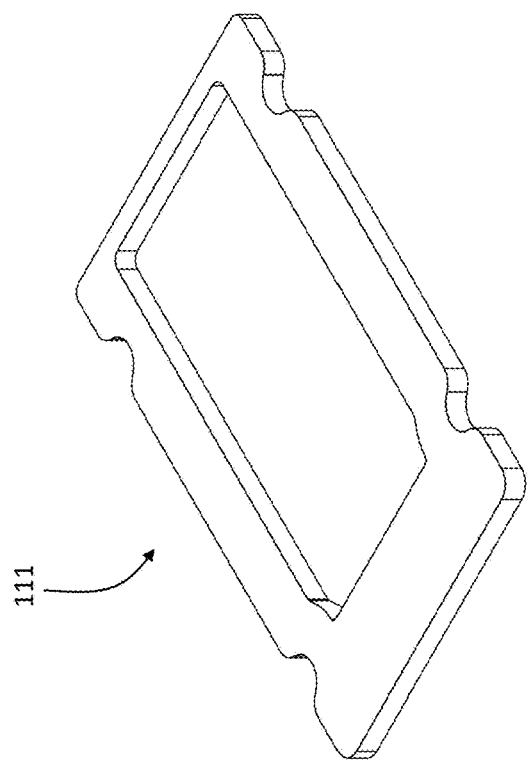
FIG. 2E is an isometric view of the cover of the first heat sink, according to some embodiments of the present invention.

FIG. 2E shows an isometric view of cover 111 of heat sink 110, according to some embodiments of the present invention. In some embodiments, cover 111 may be made from the same material as heat sink 110 (e.g., aluminum or copper).

During the manufacturing process of liquid cooling assembly 100, a blank of the desired material with approximate dimensions of the target heat sink 110 may be taken. The blank is then machined to achieve the desired dimensions and to form inner cavity 116 and contact surfaces 119A-119F. Next, openings 117A-117D and 113A-113D may be drilled. Afterward, cover 111, machined to match the dimensions of inner cavity 116, is positioned to cover cavity 116 and welded along its perimeter to seal the inner volume of cavity 116 and complete the form of channels 114A-114E and 115A-115B. Finally, the inner cavity 116 may be washed under high pressure via openings 117A-117D, to remove any debris left from the machining process.

FIG. 2F shows an isometric view of base member 150 of liquid cooling assembly 100, according to some embodiments of the present invention.

Base member 150 may have at least two groups of mounting openings, each configured to align with a respective group of mounting openings on PCB 200 when base member 150 is positioned adjacent to the bottom side of PCB 200. For example, the first group of mounting openings 210A-210D on PCB 200 (shown in FIG. 2A) may align with the first group of mounting openings 151A-151D on base member 150, and the second group of mounting openings 240A-240D on PCB 200 (shown in FIG. 2A) may align with the second group of mounting openings 152A-152D on base member 150. This positioning is explained in greater detail with reference to FIGS. 3A-3B.

It shall be understood that, in some embodiments, base member 150 may be considered an optional element, and liquid cooling assembly 100 may not include it. In such embodiments, the liquid cooling assembly may be attached to PCB 200 using same or similar mounting elements as in the embodiments with base member 150, but the connection in these scenarios may be performed directly to PCB 200. Furthermore, in some embodiments, other common parts of device 400 may be used as base member 150. For example, in some embodiments, a stiffener (a standard OEM element for this purpose) may be used as base member 150.

As known in the art, stiffeners are mechanical components used in printed circuit boards (PCBs) to provide additional support and rigidity. Stiffener is not an electrical part of the PCB but serves to reinforce areas that need to be more stable. This is particularly useful in flexible PCBs, where the stiffener helps to maintain the integrity of solder joints and supports components that might otherwise stress the flexible material.

Figure 2H:
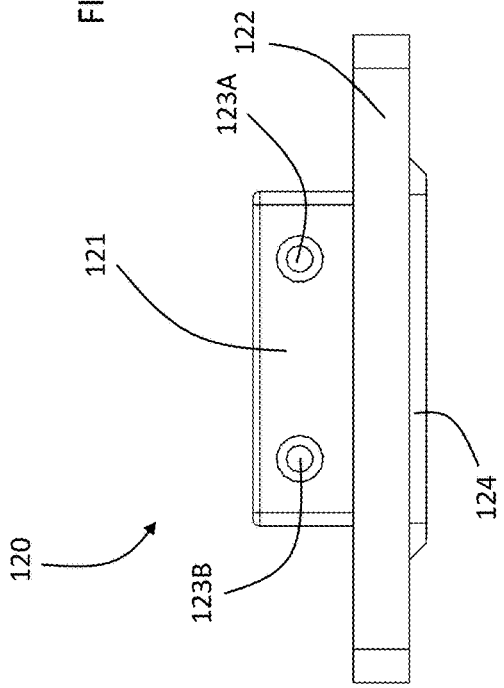
FIG. 2H is a front view of the second heat sink, according to some embodiments of the present invention.
Figure 2I:
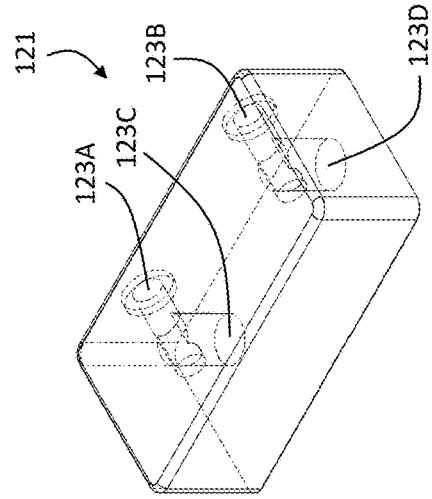
FIG. 2I is an enlarged bottom view of the communicational part of the second heat sink shown transparent, according to some embodiments of the present invention.
Figure 2G:
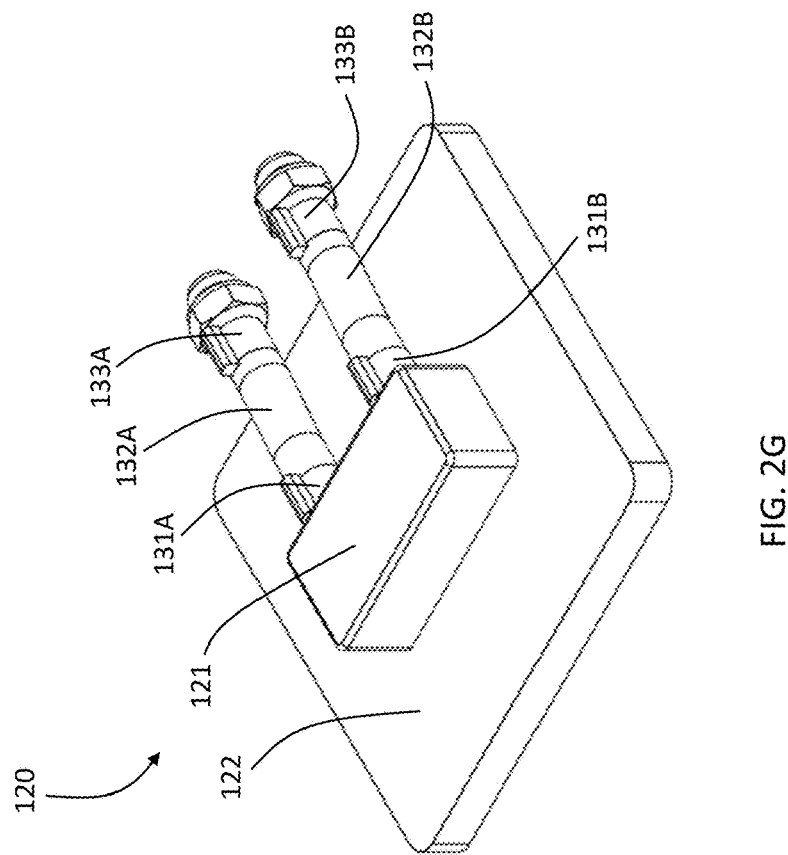
FIG. 2G is an isometric view of the top side of a second heat sink connected to the inlet and outlet flexible tubes, according to some embodiments of the present invention.

FIGS. 2G and 2H illustrate an isometric view of the top side of heat sink 120 and 2H a front view of heat sink 120, respectively, according to some embodiments of the present invention. Heat sink 120 may include portions 121 and 122. As shown in FIG. 2H, portion 121 may include inlet and outlet openings 123B and 123A, respectively, for directing the liquid coolant into and out of inner cavity 126 (shown in FIG. 2I), which is positioned inside portion 122. As shown in FIG. 2G, inlet and outlet openings 123B and 123A may be attached via fittings 131B and 131A to flexible tubes 132B and 132A, respectively, and then, via fittings 133B and 133A, to sections 116A and 116C of inner cavity 116 of heat sink 110, respectively (shown in FIG. 2B).

As shown in FIG. 2H, in some embodiments, from the bottom side, portion 122 may include contact surface 124 and may be configured to be thermally coupled with heat dissipating area of IC 230 of PCB 200 (shown in FIG. 2A) via surface 124. In particular, contact surface 124 may be sized according to the dimensions of IC 230, and portion 122 of heat sink 120 may be thermally coupled to IC 230, e.g., via thermal pad(s) attached to heat-dissipating area thereof, same as discussed with reference to FIG. 2D.

FIG. 2I shows an enlarged bottom view of the communicational part (portion 121) of heat sink 120 shown transparent, according to some embodiments of the present invention. Portion 121 may have an inner channel that connects openings 123B and 123D and thereby configured to direct liquid coolant flow, received through opening 123B, to inner cavity 126 (shown in FIG. 2J). Portion 121 may further have an inner channel that connects openings 123A and 123C and thereby configured to direct liquid coolant flow from cavity 126 to inner cavity 116 via opening 123A.

Figure 2K:
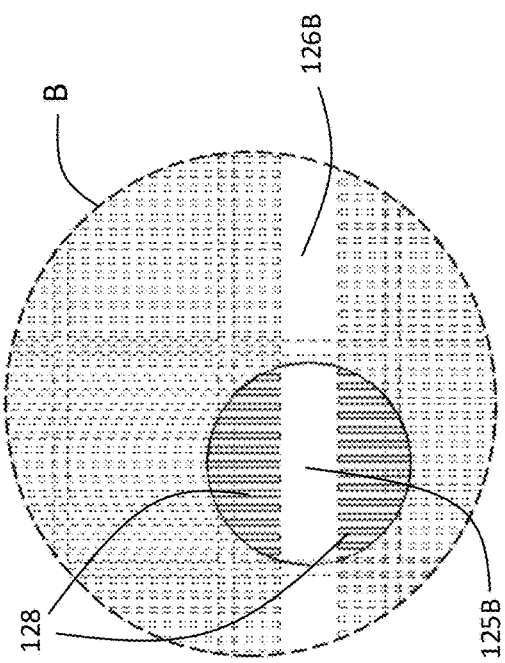
FIG. 2K is an enlarged bottom view of the second heat sink with the inner cavity thereof shown transparent, according to some embodiments of the present invention.
Figure 2J:
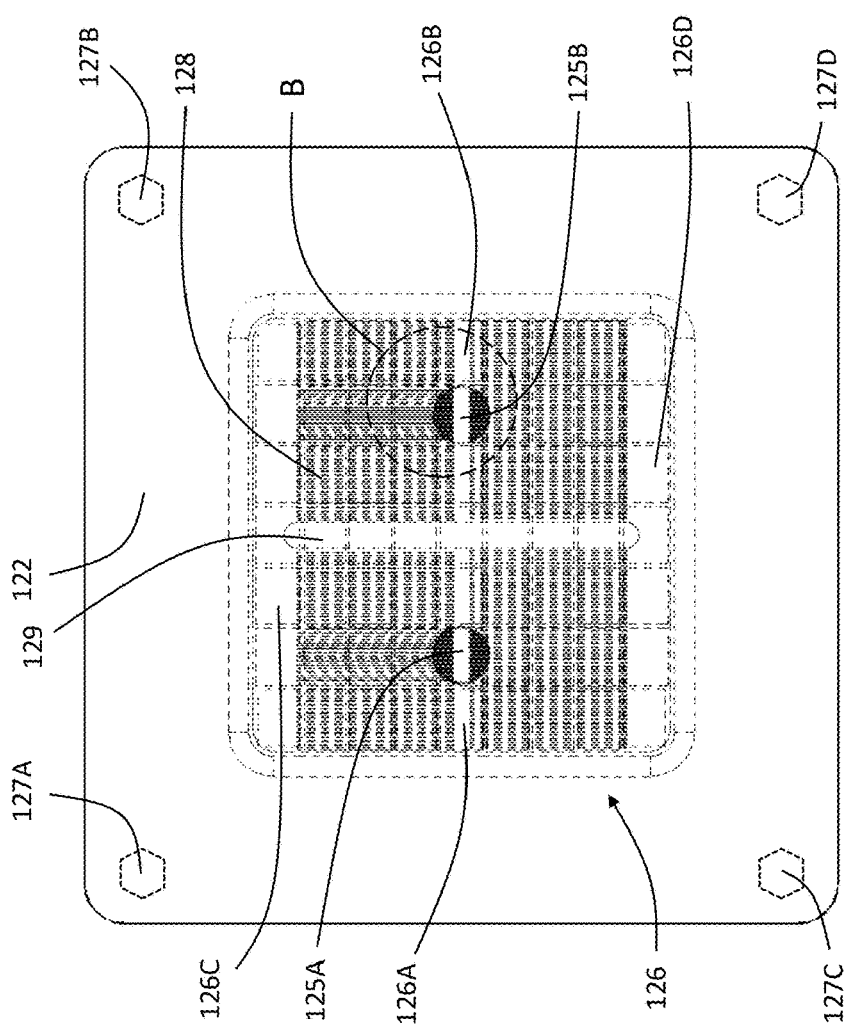
FIG. 2J is a bottom view of the second heat sink with the inner cavity thereof shown transparent, according to some embodiments of the present invention.

FIG. 2J shows a bottom view of heat sink 120 with inner cavity 126 shown transparent, according to some embodiments of the present invention. FIG. 2K shows an enlarged bottom view (marked "B" in FIG. 2J) of heat sink 120 with inner cavity 126 shown transparent, according to some embodiments of the present invention.

Inner cavity 126 may be sized according to the dimensions of IC 230. Cavity 126 may have a symmetrical configuration divided into two sections separated by wall 129. Each of these sections may include two sub-sections separated by transverse channel 126A and 126B. Each of the sub-sections may include a plurality of longitudinal inner channels separated by longitudinal walls 128 (also may be referred to as "fins"), thereby increasing the surface area for heat transfer. From two sides of cavity 126, said sections are connected via transverse channels 126C and 126D. Inner cavity 126 may further include inlet and outlet openings 125A and 125B, respectively, so that each of the openings is adjacent to the respective section of cavity 126. In other words, inner cavity 126 is configured to provide fluid connection between openings 125A and 125B through the plurality of longitudinal inner channels and transverse channels 126C and 126D.

At the conners of portion 122, heat sink 120 may have mounting openings 127A-127D for positioning standoffs 122A-122D, as explained in detail with reference to FIG. 3B.

As described above, liquid cooling assembly 100 may include two heat sinks, 110 and 120, each configured to dissipate heat from respective components of PCB 200 when attached. Heat sinks 110 and 120 are flexibly fluidically connected via tubes 132A and 132B, allowing them to move freely relative to each other. This flexibility may compensate for mechanical tolerances of the respective components (e.g., tolerances between IC 230 and ancillary components 221-225).

To leverage the benefits of this flexible connection, it is further suggested herein that heat sink 110 and heat sink 120 are each configured to be thermally coupled to respective components of PCB 200 by being pressed onto heat-dissipating areas thereof (e.g., via thermal pads, as explained above) using mechanically isolated groups of tightening elements.

The term "mechanically isolated" is used herein to describe a configuration in which each group of tightening elements is designed and configured to adjust the pressure and positioning of a respective heat sink (110 or 120) without affecting the pressure and positioning of the other heat sink (120 or 110, respectively).

These aspects of positioning are further explained with reference to FIGS. 3A and 3B.

Figure 3A:
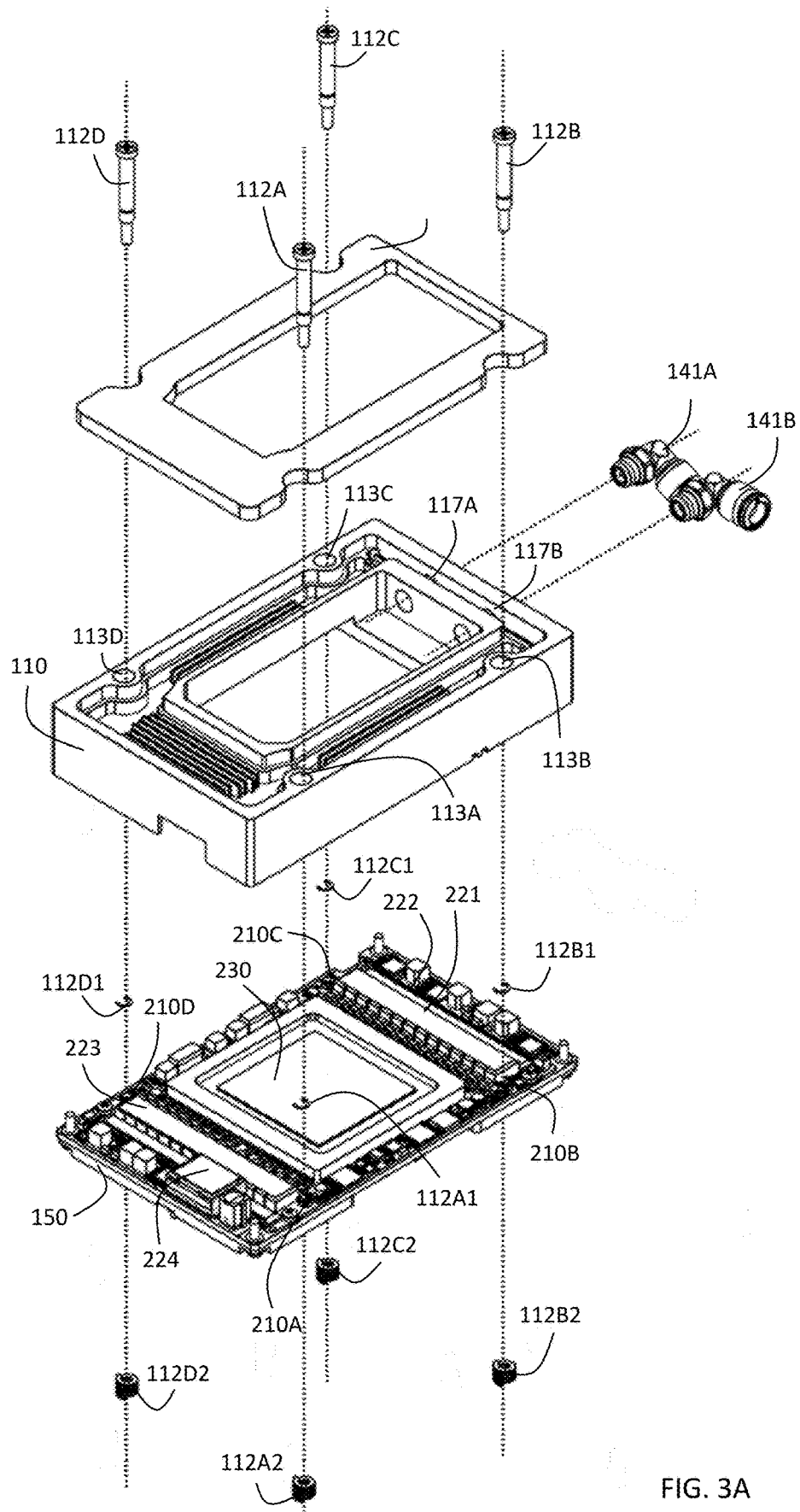
FIG. 3A is an exploded view of the liquid cooling assembly and the computing device, showing connection of the first heat sink to the PCB.

FIG. 3A shows an exploded view of liquid cooling assembly 100 (computing device 400), showing aspects of connection of heat sink 110 to PCB 200.

In some embodiments, said mechanically isolated groups of tightening elements may include a first group of spring-loaded screws 112A-112D configured to fix, in the assembled state, heat sink 110 to base member 150 through the first group of mounting openings of base member 150 (e.g., openings 151A-151D, as shown in FIG. 2F) and a respective group of mounting openings of the PCB (e.g., openings 210A-210D). Said first group of spring-loaded screws 112A-112D may be further configured to substantially uniformly press the heat sink 110 (via contact surfaces 119A-119F) onto the heat-dissipating areas of ancillary components 221-225, when being tightened.

In particular, in order to thermally couple heat sink 110 to ancillary components 221-225, each of screws 112A-112D may be threaded through respective opening 113A-113D of heat sink 110, then may be coupled with one of retaining rings 112A1-112D1, respectively. Next, screws 112A-112D may be threaded through openings 210A-210D of PCB 200 and openings 151A-151D of base member 150, respectively. Finally, screws 112A-112D may be fixed, from the bottom side of base member 150 with coiled spring washers 112A2-112D2, respectively.

As further shown in FIG. 3A, inlet and outlet fittings 141B and 141A may be connected to heat sink 110 via openings 117B and 117A, respectively.

Figure 3B:
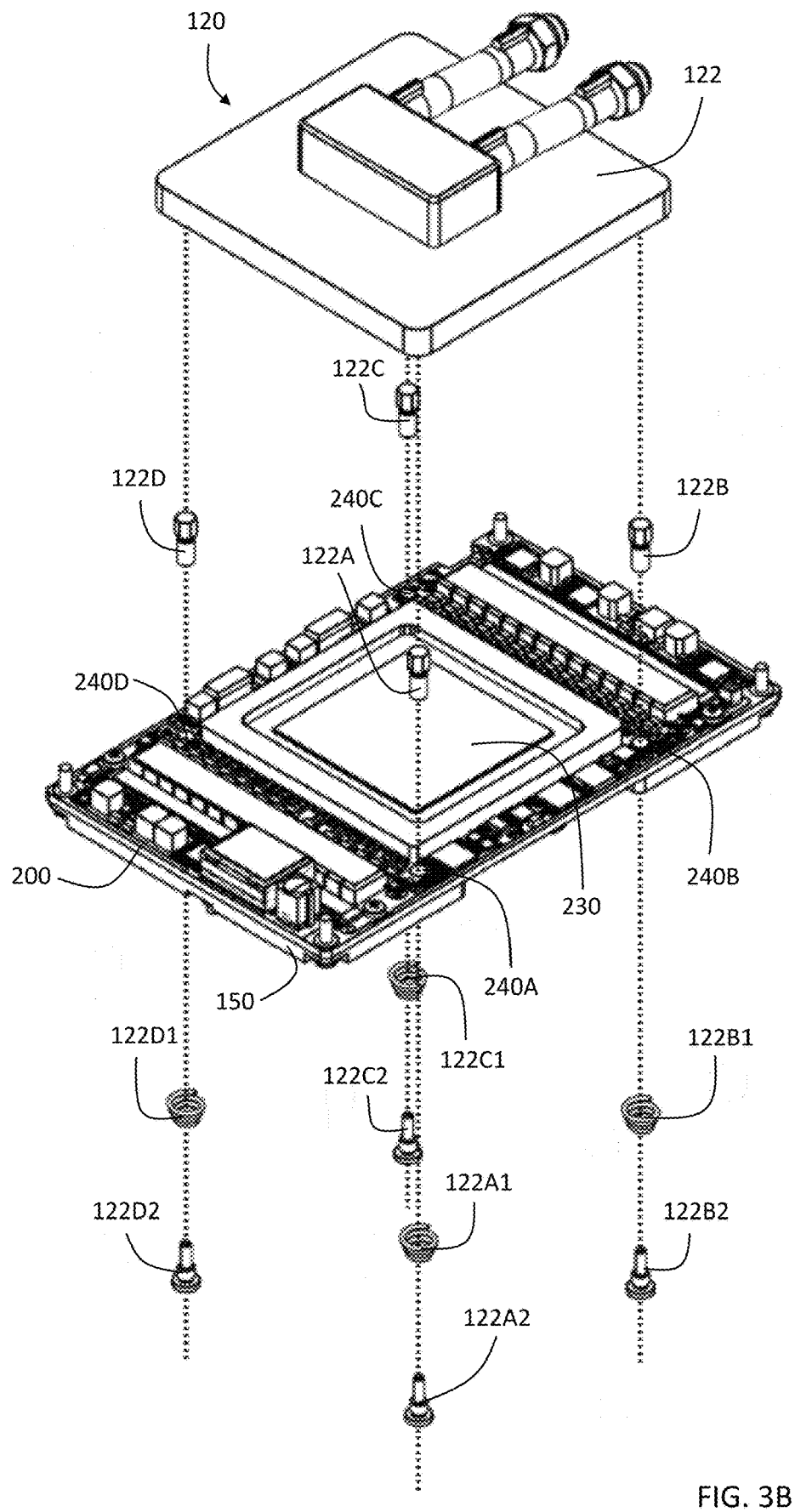
FIG. 3B is an exploded view of the liquid cooling assembly and the computing device, showing connection of the second heat sink to the PCB.

FIG. 3B shows an exploded view of liquid cooling assembly 100 and computing device 400, showing connection of heat sink 120 to PCB 200.

In some embodiments, said mechanically isolated groups of tightening elements may include a second group of spring-loaded screws 122A2-122D2 configured to fix, in the assembled state, heat sink 120 to base member 150 through the second group of mounting openings of base member 150 (e.g., openings 152A-152D, as shown in FIG. 2F) and the respective group of mounting openings of PCB 200 (e.g., openings 240A-240D). Said second group of spring-loaded screws 122A2-122D2 may be further configured to substantially uniformly press heat sink 120 (via contact surface 124, as shown in FIG. 2H) onto the heat-dissipating area of IC 230, when being tightened.

In some embodiments, heat sink 120 may further include a plurality of standoffs 122A-122D distancing, in the assembled state, a heat sink 120 from the surface of PCB 200 and comprising threaded openings (not shown) configured to receive spring-loaded screws of the second group (e.g., screws 122A2-122D2), respectively. In some embodiments, standoffs 122A-122D and said spring-loaded screws 122A2-122D2 are configured so as avoid mechanical interference with PCB 200. Accordingly, in order to thermally couple heat sink 120 to IC 230, standoffs 122A-122D may be installed in openings 127A-127D of portion 122 (as shown in FIG. 2J), respectively; then, screws 122A2-122D2 may be coupled with springs 122A1-122D1, openings 152A-152D of base member 150 and openings 240A-240D of PCB 200, respectively. Finally, screws 122A2-122D2 may be screwed into the threaded openings of standoffs 122A-122D and tightened until the proper contact between contact surface 124 and heat dissipating surface of IC 230 is achieved.

Thereby, the abovementioned mechanically isolated coupling of heat sink 110 and heat sink 120 to respective components of PCB 200 may be achieved, leveraging the benefits of flexible fluid connection between heat sinks 110 and 120 and thereby providing the desired mitigation of mechanical tolerances between these components.

Additionally, in some embodiments, to avoid undesired mechanical interferences, the diameters of screws 112A-112D, standoffs 122A-122D, and screws 122A2-122D2 may be made smaller than the diameters of the respective mounting openings (e.g., openings 210A-210D and openings 240A-240D). This adjustment may help to avoid or minimize contact between the mounting elements and PCB 200.

Figure 4:
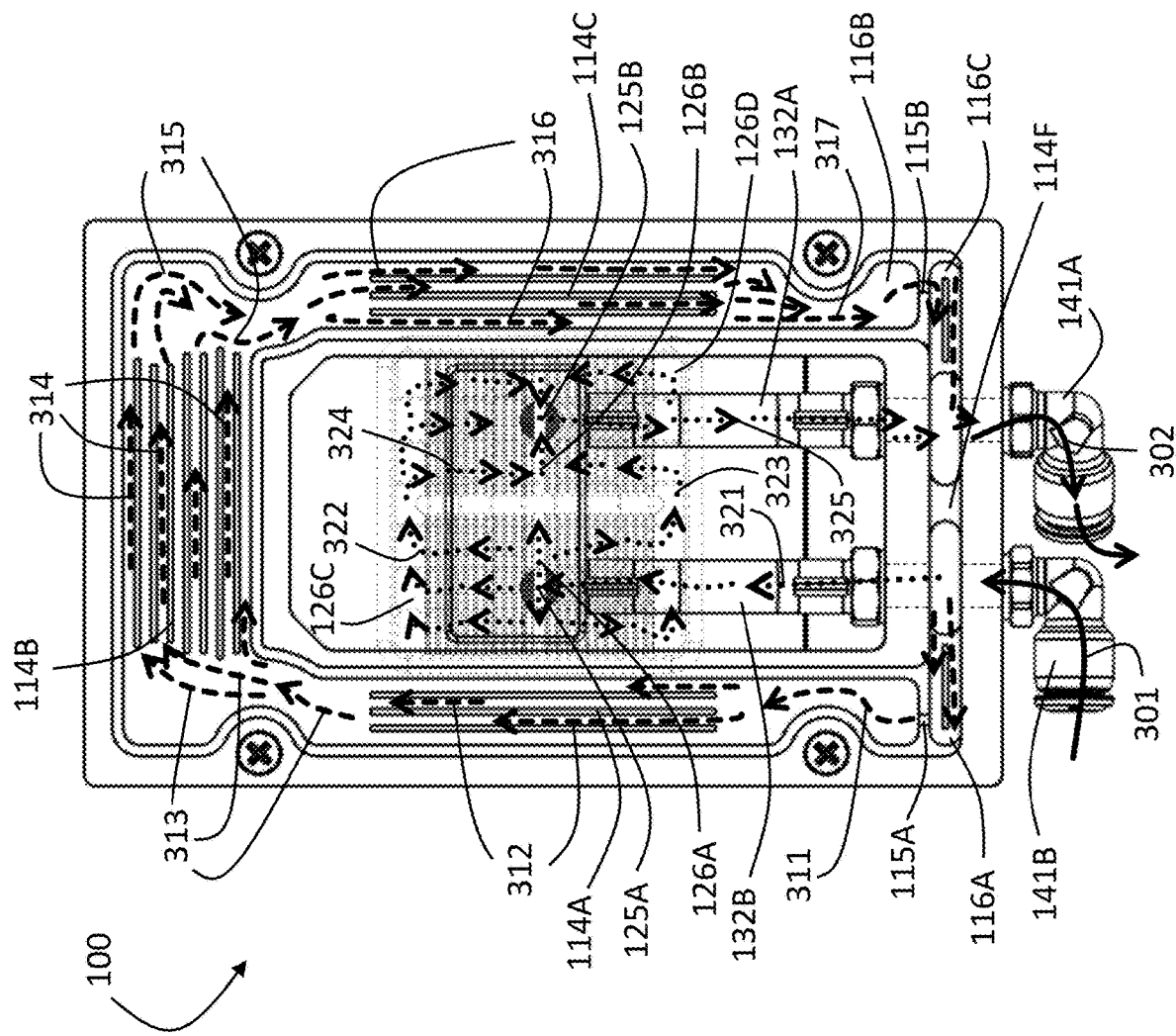
FIG. 4 is a top view of the liquid cooling assembly having the first and second heat sinks shown partially transparent, illustrating first and second liquid coolant circulation pathways, according to some embodiments of the present invention.

FIG. 4 shows atop view of liquid cooling assembly 100 having heat sinks 110 and 120 shown partially transparent, illustrating first and second liquid coolant circulation pathways, according to some embodiments of the present invention.

According to the concept of the present invention, in some embodiments, inner cavity 116 of heat sink 110 may be fluidically connectable to the liquid coolant distribution unit (not shown) and configured to form therewith a first liquid coolant circulation pathway. In some embodiments, inner cavity 126 of heat sink 120 may be in flexible fluid connection to inner cavity 116 of heat sink 110 and configured to form, together with the liquid coolant distribution unit (not shown), a second liquid coolant circulation pathway, while sharing, with the first liquid coolant circulation pathway, a common inlet and outlet connection (via openings 117A and 117B and fittings 141A and 141B to the liquid coolant distribution unit.

As shown in FIG. 4, the liquid coolant flow 301 may enter liquid cooling assembly 100 via fitting 141B. Next, in section 116A of cavity 116, the flow may be divided into two flows—one is then directed through inner cavity 116 of heat sink 110 and the other is directed through inner cavity 226 of heat sink 120, thereby forming said two liquid coolant circulation pathways. The first liquid coolant circulation pathway is shown with dashed lines and arrows, and the second liquid coolant circulation pathway is shown with dotted lines and arrows.

Following the first liquid coolant circulation pathway, the flow enters section 116B via input channel 115A. Inside section 116B flow is separated into a plurality of flows 312 passing through inner channels 114A (not shown). Next, the flow is deflected by projection 118C (shown in FIG. 2B) and thereby separated into plurality of flows 313, that form plurality of flows 314 passing through inner channels 114B. As can be seen, the walls of inner channels vary in length. The suggested configuration provides for efficient, substantially uniform separation of flows 313 between inner channels 114B. After passing channels 114B, flows 315 are deflected by projection 118A and thereby form flows 316 substantially uniformly separated between inner channels 114C (shown in FIG. 2B). After that, flows 317 are deflected by projection 118B and, through output channel 115B, exit section 116B and enter section 116C. In section 116C, flows are mixed with the output flow from the second liquid coolant circulation pathway (the one going through heat sink 120) to form flow 302 that exits the liquid cooling assembly via common outlet connection—fitting 141A. It shall be understood that sections 116A and 116C are separated by inner wall 114F.

Following the second liquid coolant circulation pathway, the flow 321 goes through tube 132B and, through opening 125A, enters inner cavity 126. Then, the flow goes through transverse channel 126A and divides into multiple sub-flows passing through longitudinal inner channels separated by longitudinal walls 128 in opposite longitudinal directions. After passing through longitudinal inner channels, flows are mixed again (e.g., flow 322) and are directed through transverse channels 126C and 126D. After passing channels 126C and 126D, flows are again divided into multiple sub-flows (e.g., flows 324) passing through the longitudinal inner channels. Next, flows 324 are again combined in transverse channel 126B and exit inner cavity 126 via opening 125B. After that, flow 325 is directed via tube 132A to section 116C, wherein it is mixed with the flows of the first liquid coolant circulation pathway. Finally, the liquid coolant flow 302 exits the liquid coolant assembly 100 via common outlet connection—opening 117A and—fitting 141A.

According to the concept of the present invention, the size and position of channels 115A and 115B may be one of the key aspects of liquid cooling efficiency. As the separation between the liquid cooling circulation pathways may be performed passively, it may be preset by the ratio in which flow 301 is divided into first and second liquid coolant circulation pathways. Accordingly, liquid cooling assembly 100 may be further configured to split an input liquid coolant flow 301 between said first liquid coolant circulation pathway and said second liquid coolant circulation pathway in the predefined ratio.

In some embodiments, said ratio may be determined at the design stage, corresponding to an expected power consumption ratio between the respective components of PCB 200, e.g., between IC 230 and the group of ancillary components 221-225.

It shall be understood that, depending on embodiments, said ratio may vary significantly. E.g., in some power-intensive embodiments, the expected power consumption of IC 230 may be up to 800 W, and the power consumption of ancillary components may be up to 200 W. Accordingly, said ratio may be ¼.

Accordingly, to provide the desired ratio, input channel of heat sink 110 (e.g., input channel 115A) and the input channel of heat sink 120 (e.g., opening 125A) may be sized corresponding to said predefined ratio. Furthermore, to provide the desired ratio, output channel of heat sink 110 (e.g., output channel 115B) and the output channel of heat sink 120 (e.g., opening 125B) may be sized corresponding to said predefined ratio.

At the design stage, the input data for designing the liquid cooling assembly 100 may include the quantity and layout of the IC and critical ancillary components that require heat management, as well as their expected power consumption. The dimensions of input channel 115A and output channel 115B can then be determined in relation to the sizes of openings 125A and 125B, corresponding to the ratio of the expected power consumption. The required flow rate of fittings 141A and 141B can, in turn, be determined based on the maximum value of the power consumption.

Thereby, the suggested invention further contributes to the improvement of the relevant technological field by simplifying manufacturing process for producing customized liquid cooling assembles.

One common problem in liquid fluid circulation systems is airlock. Airlock occurs when air gets trapped in the system, often in the upper sections, preventing the proper flow of liquid. This effect can significantly hinder the system's efficiency and cooling performance.

To avoid airlock issues, it is suggested that the input channel 115A and output channel 115B of heat sink 110 be positioned adjacent to the upper wall of inner cavity 116. For example, in the illustrated embodiment, channels 115A and 115B have a rectangular cross-section, with the upper wall formed by cover 111. This arrangement allows channels 115A and 115B to be adjacent to the upper wall, effectively mitigating airlock issues. Air bubbles that may enter cavity 116 will easily pass through and exit the liquid cooling assembly.

The same concept may be further applicable to heat sink 120. As openings 125A and 125B may be made in the upper wall of inner cavity 126 (and therefore adjacent thereto), as shown e.g., in FIG. 2J, the airlock issue may be effectively mitigated.

Accordingly, the described configuration of liquid cooling assembly 100 may effectively apply heat sinks 110 and 120 to absorb heat from the components of PCB 200 and transfer it to the liquid media (also referred herein as "liquid coolant") through convection and radiation.

In some embodiments, the liquid coolant may include water, glycol mixtures, and/or dielectric fluids as commonly known in the art, or other liquids having high thermal conductivity and heat capacity.

It should be understood that all discussions related to flow directions, including terms such as "input," "output," "inlet," "outlet," "enter," "exit," and similar, are provided for clarity only and should not be considered as limiting the scope of the present invention. Accordingly, in some embodiments, flow directions may be reversed, and all relevant elements should be considered as providing the opposite function, e.g., "outputting" instead of "inputting," etc.

As can be seen from the provided description, the claimed invention represents a liquid cooling assembly that provides an improvement to the technological field of microelectronics and electronic engineering. Specifically, the suggested solution is easily adjustable to mitigate mechanical tolerances between the different electrical components of the target PCB and adaptable to address the diverse thermal loads presented by them, while maintaining the compactness of the design. The suggested solution thereby increases the overall heat dissipation efficiency of thermal management systems.

The present invention further represents a computing device that includes such an improved liquid cooling assembly, which, in turn, improves the aforementioned technological field by increasing device operation efficiency, specifically enabling prolonged and stable operation in computationally intensive regimes due to highly efficient thermal management.

Unless explicitly stated, the method embodiments described herein are not constrained to a particular order or sequence. Furthermore, all formulas described herein are intended as examples only and other or different formulas may be used. Additionally, some of the described method embodiments or elements thereof may occur or be performed at the same point in time.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A liquid cooling assembly, comprising:
   at least one first heat sink, configured to be thermally coupled to at least one first electronic component mounted on a printed circuit board (PCB); and
   at least one second heat sink, configured to be thermally coupled to at least one second electronic component mounted on the PCB;
   said at least one first heat sink having an inner cavity fluidically connectable to a liquid coolant distribution unit and configured to form therewith a first liquid coolant circulation pathway;
   said at least one second heat sink having an inner cavity in flexible fluid connection to the inner cavity of said at least one first heat sink and configured to form, together with the liquid coolant distribution unit, a second liquid coolant circulation pathway, while sharing, with the first liquid coolant circulation pathway, a common inlet and outlet connection to the liquid coolant distribution unit; wherein said at least one first electronic component comprises a group of ancillary electronic components mounted in a peripheral area of the PCB;

said at least one second electronic component comprises an integrated circuit (IC) mounted in a central area of the PCB;

said at least one first heat sink has a frame-shaped structure sized corresponding to dimensions of said peripheral area; and said at least one second heat sink is configured so as to be positioned substantially within said frame-shaped structure, when the liquid cooling assembly is attached to the PCB.

2. The liquid cooling assembly of claim 1, wherein said flexible fluid connection comprises at least one flexible inlet tube and at least one flexible outlet tube fluidically connecting the inner cavity of said at least one second heat sink with the inner cavity of said at least one first heat sink from the inner side of the frame-shaped structure.

3. The liquid cooling assembly of claim 1, wherein said at least one first heat sink and said at least one second heat sink are each configured to be thermally coupled to said at least one first electronic component and said at least one second electronic component, respectively, by being pressed onto heat-dissipating areas thereof using mechanically isolated groups of tightening elements.

4. The liquid cooling assembly of claim 3, further comprising a base member having at least two groups of mounting openings configured so as to align with respective groups of mounting openings of the PCB, when the base member is positioned adjacent to the bottom side of the PCB, in an assembled state of the liquid cooling assembly; and wherein said mechanically isolated groups of tightening elements comprise:

a first group of spring-loaded screws configured to fix, in the assembled state, said at least one first heat sink to the base member through a first group of mounting openings of the base member and a respective group of mounting openings of the PCB, and to substantially uniformly press the first heat sink onto the heat-dissipating area of said at least one first electronic component, when being tightened; and a second group of spring-loaded screws configured to fix, in the assembled state, said at least one second heat sink to the base member through a second group of mounting openings of the base member and a respective group of mounting openings of the PCB, and to substantially uniformly press the second heat sink onto the heat-dissipating area of said at least one second electronic component, when being tightened.

5. The liquid cooling assembly of claim 4, wherein at least one of said first heat sink or said second heat sink comprises a plurality of standoffs distancing, in the assembled state, a respective heat sink from the PCB and comprising threaded openings configured to receive a respective group of spring-loaded screws.

6. The liquid cooling assembly of claim 5, wherein said standoffs and said spring-loaded screws are configured so as avoid mechanical interference with the PCB.

7. The liquid cooling assembly of claim 1, further configured to split an input liquid coolant flow, passing through the common inlet connection, between said first liquid coolant circulation pathway and said second liquid coolant circulation pathway in a predefined ratio.

8. The liquid cooling assembly of claim 7, wherein said predefined ratio is defined corresponding to an expected power consumption ratio between said at least one first electronic component and said at least one second electronic component.

9. The liquid cooling assembly of claim 7, further configured to split the input liquid coolant flow by directing a first portion thereof through an input channel of said at least one first heat sink and a second portion thereof through an input channel of said at least one second heat sink, said input channel of said at least one first heat sink and the input channel of said at least one second heat sink being sized corresponding to said predefined ratio.

10. The liquid cooling assembly of claim 9, wherein the input channel of said at least one first heat sink and an output channel of said at least one first heat sink are made adjacent to an upper wall of the inner cavity of said at least one first heat sink.

11. The liquid cooling assembly of claim 9, wherein the input channel of said at least one second heat sink and an output channel of said at least one second heat sink are made adjacent to an upper wall of the inner cavity of said at least one second heat sink.

12. The liquid cooling assembly of claim 1, wherein said inner cavity of said at least one first heat sink comprises a plurality of inner channels; and said inner cavity of the at least one first heat sink being shaped so as to distribute a liquid coolant flow passing therethrough substantially evenly between the plurality of inner channels thereof.

13. The liquid cooling assembly of claim 1, wherein said inner cavity of said at least one second heat sink comprises a plurality of inner channels; and said inner cavity of the at least one second heat sink is shaped so as to distribute a liquid coolant flow passing therethrough substantially evenly between the plurality of inner channels thereof.

14. The liquid cooling assembly of claim 1, wherein said at least one first heat sink, configured to be thermally coupled to said at least one first electronic component via a thermal pad attached to a heat-dissipating area thereof.

15. The liquid cooling assembly of claim 1, wherein said at least one second heat sink, configured to be thermally coupled to said at least one second electronic component via a thermal pad attached to a heat-dissipating area thereof.

16. A computing device, comprising:

a printed circuit board (PCB) comprising at least one first electronic component and at least one second electronic component mounted thereon;

at least one first heat sink thermally coupled to said at least one first electronic component; and at least one second heat sink thermally coupled to said at least one second electronic component;

said at least one first heat sink having an inner cavity fluidically connectable to a liquid coolant distribution unit and configured to form therewith a first liquid coolant circulation pathway;

said at least one second heat sink having an inner cavity in flexible fluid connection to the inner cavity of said at least one first heat sink and configured to form, together with the liquid coolant distribution unit, a second liquid coolant circulation pathway, while sharing, with the first liquid coolant circulation pathway, a common inlet and outlet connection to the liquid coolant distribution unit; wherein said at least one first electronic component comprises a group of ancillary electronic components mounted in a peripheral area of the PCB;

said at least one second electronic component comprises an integrated circuit (IC) mounted in a central area of the PCB;

said at least one first heat sink has a frame-shaped structure sized corresponding to dimensions of said peripheral area; and said at least one second heat sink is positioned substantially within said frame-shaped structure.

17. The computing device of claim 16, wherein said flexible fluid connection comprises at least one flexible inlet tube and at least one flexible outlet tube fluidically connecting the inner cavity of said at least one second heat sink with the inner cavity of said at least one first heat sink from the inner side of the frame-shaped structure.

18. The computing device of claim 16, wherein said at least one first heat sink and said at least one second heat sink are each thermally coupled to said at least one first electronic component and said at least one second electronic component, respectively, by being pressed onto heat-dissipating areas thereof using mechanically isolated groups of tightening elements.

19. A liquid cooling assembly, comprising:

at least one first heat sink, configured to be thermally coupled to at least one first electronic component mounted on a printed circuit board (PCB);

at least one second heat sink, configured to be thermally coupled to at least one second electronic component mounted on the PCB; and a base member having at least two groups of mounting openings configured so as to align with respective groups of mounting openings of the PCB, when the base member is positioned adjacent to the bottom side of the PCB, in an assembled state of the liquid cooling assembly;

said at least one first heat sink having an inner cavity fluidically connectable to a liquid coolant distribution unit and configured to form therewith a first liquid coolant circulation pathway;

said at least one second heat sink having an inner cavity in flexible fluid connection to the inner cavity of said at least one first heat sink and configured to form, together with the liquid coolant distribution unit, a second liquid coolant circulation pathway, while sharing, with the first liquid coolant circulation pathway, a common inlet and outlet connection to the liquid coolant distribution unit;

wherein said at least one first heat sink and said at least one second heat sink are each configured to be thermally coupled to said at least one first electronic component and said at least one second electronic component, respectively, by being pressed onto heat-dissipating areas thereof using mechanically isolated groups of tightening elements; and wherein said mechanically isolated groups of tightening elements comprise:

a first group of spring-loaded screws configured to fix, in the assembled state, said at least one first heat sink to the base member through a first group of mounting openings of the base member and a respective group of mounting openings of the PCB, and to substantially uniformly press the first heat sink onto the heat-dissipating area of said at least one first electronic component, when being tightened; and a second group of spring-loaded screws configured to fix, in the assembled state, said at least one second heat sink to the base member through a second group of mounting openings of the base member and a respective group of mounting openings of the PCB, and to substantially uniformly press the second heat sink onto the heat-dissipating area of said at least one second electronic component, when being tightened.

20. The liquid cooling assembly of claim 19, wherein at least one of said first heat sink or said second heat sink comprises a plurality of standoffs distancing, in the assembled state, a respective heat sink from the PCB and comprising threaded openings configured to receive a respective group of spring-loaded screws.

* * * * *